(12) United States Patent
Decker et al.

(10) Patent No.: US 7,575,443 B2
(45) Date of Patent: Aug. 18, 2009

(54) COMBINED FASTENING AND CONTACTING SYSTEM FOR ELECTRICAL COMPONENTS ON SUPERIMPOSED CIRCUIT BOARDS

(75) Inventors: Michael Decker, Regensburg (DE); Günter Hötzl, Regensburg (DE); Tobias Kern, Pfatter (DE); Bernhard Lichtinger, Sünching (DE)

(73) Assignee: Continental Automotive AG, Munich (DE)

( * ) Notice: Subject to any disclaimer, the term of this patent is extended or adjusted under 35 U.S.C. 154(b) by 0 days.

(21) Appl. No.: 12/067,464

(22) PCT Filed: Jul. 27, 2006

(86) PCT No.: PCT/EP2006/064740

§ 371 (c)(1),
(2), (4) Date: Mar. 20, 2008

(87) PCT Pub. No.: WO2007/033849

PCT Pub. Date: Mar. 29, 2007

(65) Prior Publication Data

US 2008/0207020 A1    Aug. 28, 2008

(30) Foreign Application Priority Data

Sep. 20, 2005 (DE) .................. 10 2005 044 867

(51) Int. Cl.
*H01R 12/00* (2006.01)
(52) U.S. Cl. .................................. 439/76.1; 439/75
(58) Field of Classification Search ............. 439/76.1, 439/76.2, 74, 75, 949
See application file for complete search history.

(56) References Cited

U.S. PATENT DOCUMENTS

| 4,998,342 | A | 3/1991 | Bonnell et al. |
| 6,341,976 | B1 | 1/2002 | Jacob et al. |
| 6,690,582 | B2 * | 2/2004 | Sumida ...................... 361/752 |
| 6,692,310 | B2 * | 2/2004 | Zaderej et al. .............. 439/701 |
| 6,839,240 | B2 | 1/2005 | Skofljanec et al. |
| 7,074,053 | B2 * | 7/2006 | Kawakita et al. ........... 439/76.1 |
| 7,090,511 | B2 * | 8/2006 | Smirra ....................... 439/76.1 |
| 7,172,432 | B2 * | 2/2007 | Campini et al. .............. 439/74 |
| 2004/0007379 | A1 * | 1/2004 | Suzuki et al. ................. 174/59 |

(Continued)

FOREIGN PATENT DOCUMENTS

CA        2286030 A1    4/1998

(Continued)

*Primary Examiner*—Neil Abrams
*Assistant Examiner*—Phuong Nguyen
(74) *Attorney, Agent, or Firm*—Laurence A. Greenberg; Werner H. Stemer; Ralph E. Locher

(57) ABSTRACT

The invention relates to a combined fastening and contacting system for electrical components on superimposed circuit boards in an electronic housing, especially for the automobile sector, as well as a method for fastening and contacting electrical components. The novel fastening and contacting system has two parts, one of which is embodied as a holding frame for electrical components while the other part is configured as a pressing frame for fixing the holding frame. There is formed a combined fastening and contacting system for electrical components on superimposed circuit boards, which makes it possible to replace faulty electrical components in a simple fashion while allowing superimposed circuit boards to be electrically contacted in a safe manner. The system is particularly suitable for the automobile sector.

10 Claims, 13 Drawing Sheets

U.S. PATENT DOCUMENTS

| | | |
|---|---|---|
| 2004/0253851 A1 | 12/2004 | Naitou et al. |
| 2005/0020104 A1* | 1/2005 | Yamamoto et al. .......... 439/76.1 |
| 2005/0026467 A1* | 2/2005 | Smirra ...................... 439/76.1 |
| 2006/0154499 A1 | 7/2006 | Naito et al. |
| 2006/0178023 A1* | 8/2006 | Matsumura ................ 439/76.1 |

FOREIGN PATENT DOCUMENTS

| | | |
|---|---|---|
| DE | 4208765 A1 | 8/1993 |
| DE | 19913660 A1 | 11/2000 |
| DE | 20115670 U1 | 3/2002 |
| DE | 10159113 A1 | 6/2003 |
| DE | 10258838 A1 | 7/2004 |
| EP | 0419065 A2 | 3/1991 |
| EP | 1487054 A1 | 12/2004 |
| JP | 2005005222 A | 1/2005 |
| WO | 9851135 A1 | 11/1998 |

* cited by examiner

COMBINED FASTENING AND CONTACTING SYSTEM FOR ELECTRICAL COMPONENTS ON SUPERIMPOSED CIRCUIT BOARDS

BACKGROUND OF THE INVENTION

Field of the Invention

The invention relates to a combined fastening and contacting system for electrical components on superimposed circuit boards for an electronic housing, in particular for the automobile sector.

The fixing of wired component parts to the circuit board using hot-melt adhesive is known from the prior art.

To this end, EP 0 419 065 A2 discloses a method, in which, on its first side in a soldering paste printing station, a circuit board is firstly printed with solder areas at the points provided to attach SMD components (SMD=Service Mounted Device). In an adhesive station, the circuit board is then provided with a droplet of adhesive between the soldering points to fix the SMD components and is subsequently equipped with SMD components on a pick and place machine, said components being placed on the solder areas and the adhesive. As the components have to be pressed into the adhesive, the precise attachment of the components can be impeded by the adhesive. After the assembly process, the adhesive hardens and the circuit board is conveyed to a reflow soldering station, in which the solder imprinted on the first side is melted and the components are soldered to the circuit board. After the first reflow soldering step, the circuit boards are turned with the second side uppermost and are printed again with solder areas and then equipped with SMD components.

DE 199 13 660 A1 discloses a method for fastening electrical components to circuit boards, which are enclosed by a housing, with the components being held by a holding device. In this process, the electrical component is held in the circuit board during the assembly and during operation by means of a holding device and is adhesively connected to a housing surface of the housing surrounding the circuit board.

The use of adhesive is disadvantageous in that this creates a non-detachable connection between the component parts to be connected. This results in the entire assembly being rendered unusable in the event of an electrical component being faulty. In addition, the adhesive now fulfils the function of safely fixing the electrical components in a position, but does not provide the possibility of electrically contacting superimposed circuit boards in a safe manner. Flexible elements are needed for this, such as flat ribbon cables for instance. The disadvantages with the use of flat ribbon cables consists in a maximum power transmission mostly only being possible for signal contacts and the positioning on the circuit board having a mostly negative affect on the electromagnetic compatibility. High demands are also placed on the vibrational resistance of the freely-oscillating cable, which can also already be damaged or destroyed during assembly, particularly in electronic housings for the automobile sector. In particular, longer cables exhibit high losses for critical power levels and have a negative effect on the electromagnetic compatibility. It is particularly disadvantageous when using plug connections that the plug connection requires a housing, which in turn demands an increased amount of space.

A service box emanates from DE 42 08 765 A1, which has one or a number of printed circuit boards which are separated from one another by means of insulation having printed circuits made of conductive material attached to one or both sides thereof, onto which component parts are plugged and soldered, with the printed circuits on both sides of a printed circuit board or the printed circuits of several printed circuit boards being electrically conductively connected by means of pins. It is however disadvantageous here for the pins enabling the electrical contacting to have to be precisely inserted into a plug holder, which results in an assembly problem as a result of the plurality of pins and the mechanical overdefinition associated therewith.

BRIEF SUMMARY OF THE INVENTION

Based on this, the object underlying the present invention is to create a combined fastening and contacting system for electrical components on superimposed circuit boards, which enables faulty electrical components to be replaced in a simple fashion while also allowing superimposed circuit boards to be electrically contacted in a safe manner.

This object is achieved by a combined fastening and contacting system with the features of claim 1 as well as by a method for fastening and contacting electrical components. Advantageous configurations and developments, which can be used individually or in combination with one another, are the subject matter of the dependent claims.

The inventive, combined fastening and contacting system for electrical components on superimposed circuit boards is characterized in that the system has two parts, one of which is embodied as a holding frame for electrical components while the other is configured as a pressing frame with pressing pins. In accordance with the invention, provision is made to fix the circuit board between the holding frame and pressing frame, with the pressing frame being arranged on the underside of the circuit board and the holding frame being mounted on the circuit board. The holding frame is fixed by the pressing spikes of the pressing frame, which are guided through the circuit board. The pressing frame defines the distance between the circuit board and stabilizes the circuit board mounted in a sandwich-like fashion between the holding frame and the pressing frame, if it is subjected to vibrations. It is also advantageous for this circuit board to be pressed onto the heat sink, thereby enabling an optimum cooling effect.

The holding frame dispenses with the need for screw holes on the main circuit board. An improved routing of the processor is also possible.

The pressing pins can be advantageously positioned in a flexible fashion so that their arrangement can be adjusted to the respective conditions in the electronic housing. It is also advantageous for the pressing pins to be flexibly and elastically tied to the pressing frame, so that possible tolerances are balanced. This also enables a balancing in respect of the overdefinition of the superimposed circuit boards, which is benefited by the Z-geometry of the pressing pins and by the elastic configuration of the pin receptacle. In addition, the pressing pins can be used both for signal and power lines. In respect of the electromagnetic compatibility, it is also possible to position the pressing pins in the vicinity of the plug. A high number of pins is also possible by means of a compact design.

It is also advantageous for the two circuit boards to be able to be assembled outside the housing, as a result of which the examination of electrical contactings can also be simplified. The final assembly of the circuit board unit in the electronic housing can be easily implemented.

It is preferred for the circuit board to be mounted between the holding frame and the pressing pins in a sandwich-like fashion. This arrangement allows the circuit board to be mounted in a vibration-safe fashion, as a result of which a safe electrical contacting of the superimposed circuit boards is achieved. It is also preferred for the holding frame to have differently shaped connectors for the electrical components. This results in it also being possible to safely fix exotic electrical components.

It is advantageous if the holding frame has penetration bores, which accommodate the pressing spikes of the pressing frame so that the holding frame is fixedly positioned on the circuit board. No additional tools, such screws as for instance, are needed to fix the holding frame.

The pressing frame preferably has pressing spikes for the penetration bores of the holding frame, it being by means of pressing technology within the production step, both to position the holding frame in a fixed position and also to carry out the contacting between the circuit boards.

It is also preferred if the pressing frame has centering pins. These facilitate the precise positioning of the circuit board prior to the pressing process and thus serve as pre-centering means.

It is advantageous if the pressing pins are designed to be Z-shaped, so that a balance in respect of the overdefinition of both circuit boards is possible.

It is also advantageous for the pressing frame to have positioning bolts, which allow it to be fixed to the main circuit board.

The method according to the invention for fastening and contacting electrical components on superimposed circuit boards in an electronic housing has the following steps: positioning a holding frame with penetration bores and connectors for electrical components on the top side of a circuit board; equipping the holding frame with electrical components; positioning a pressing frame with pressing spikes, centering pins and positioning bolts below the circuit board; pressing the centering pins and pressing pins into the circuit board and/or pressing the pressing spike into the penetration bores of the holding frame to form a combined module; pressing this combined module by means of pressing pins and positioning bolts of the pressing frame on a main circuit board and screwing the circuit boards fixed one above the other in an electronic housing.

The advantage of the method according to the invention lies in both the fastening of the electrical components as well as the electrical contacting of a circuit board being carried out by the pressing pins in one working step. In addition, faulty electrical components can be replaced in a simple fashion, since they are not fastened using adhesive.

The present invention advantageously firstly produces a combined fastening and contacting system for electrical components on superimposed circuit boards, which allows faulty electrical components to be replaced in a simple fashion as well as allowing superimposed circuit boards to be electrically contacted in a safe fashion. It is suited in particular to the automobile sector.

Further advantages and embodiments of the invention are described in detail below with reference to exemplary embodiments as well as the drawings, in which;

BRIEF DESCRIPTION OF THE SEVERAL OF THE DRAWING

DESCRIPTION OF THE INVENTION

Figure 1:
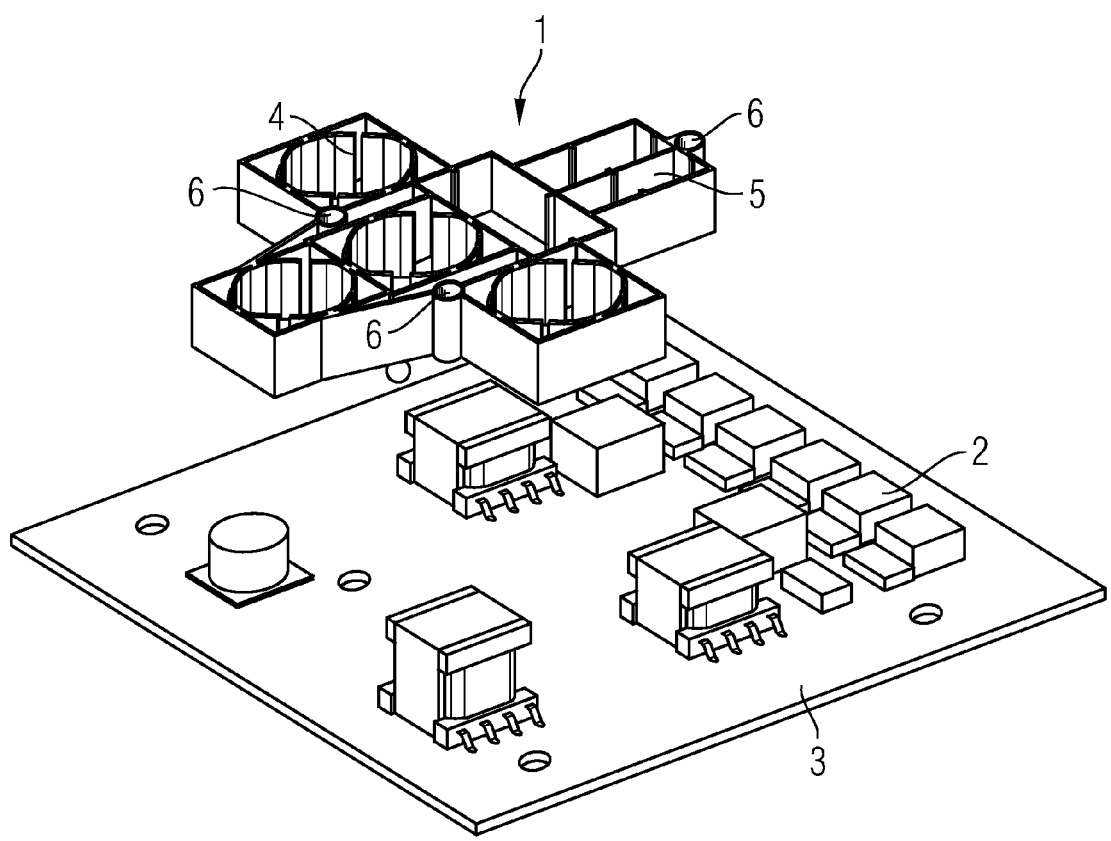
FIG. 1 shows a schematic representation of a top view of a first exemplary embodiment of an inventive holding frame for electrical components prior to positioning on a circuit board.

FIG. 1 shows a top view of a first exemplary embodiment of an inventive holding frame 1 for electrical components prior to positioning on a circuit board 3 equipped with electrical components 2. The holding frame 1 can be adjusted to the spatial conditions on the circuit board 3 in respect of its geometric form and is thus fully variable. The holding frame 1 has connectors 4, 5, which are suited both to accommodating concentric, as well as quadratic wired components, with other geometric form also being conceivable here. In addition, penetration bores 6 are arranged on different contact points of the holding frame 1, said penetration bores subsequently being used to accommodate pressing spikes during the pressing process.

Figure 2:
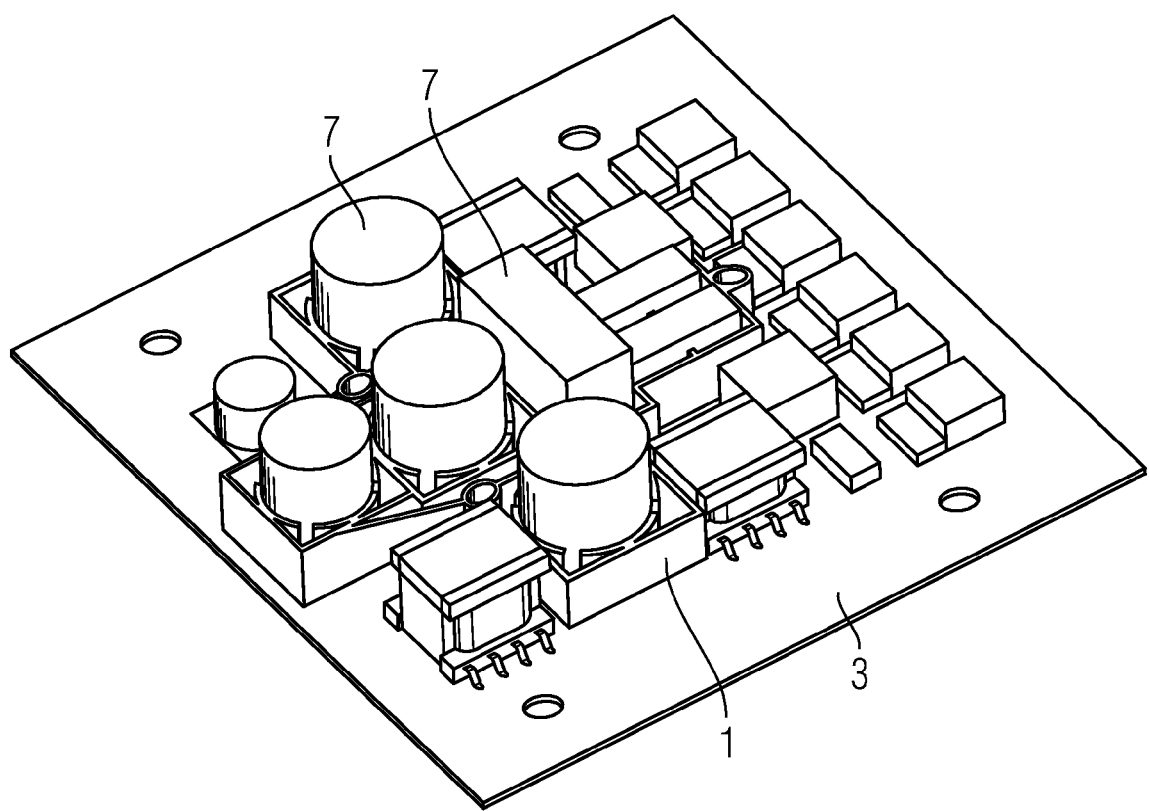
FIG. 2 shows a schematic representation of a top view of the holding frame as claimed in FIG. 1, after positioning on the circuit board.

FIG. 2 shows a top view of the holding frame 1 according to FIG. 1 after positioning the circuit board 3 and after equipping it with electrical components 7.

Figure 3:
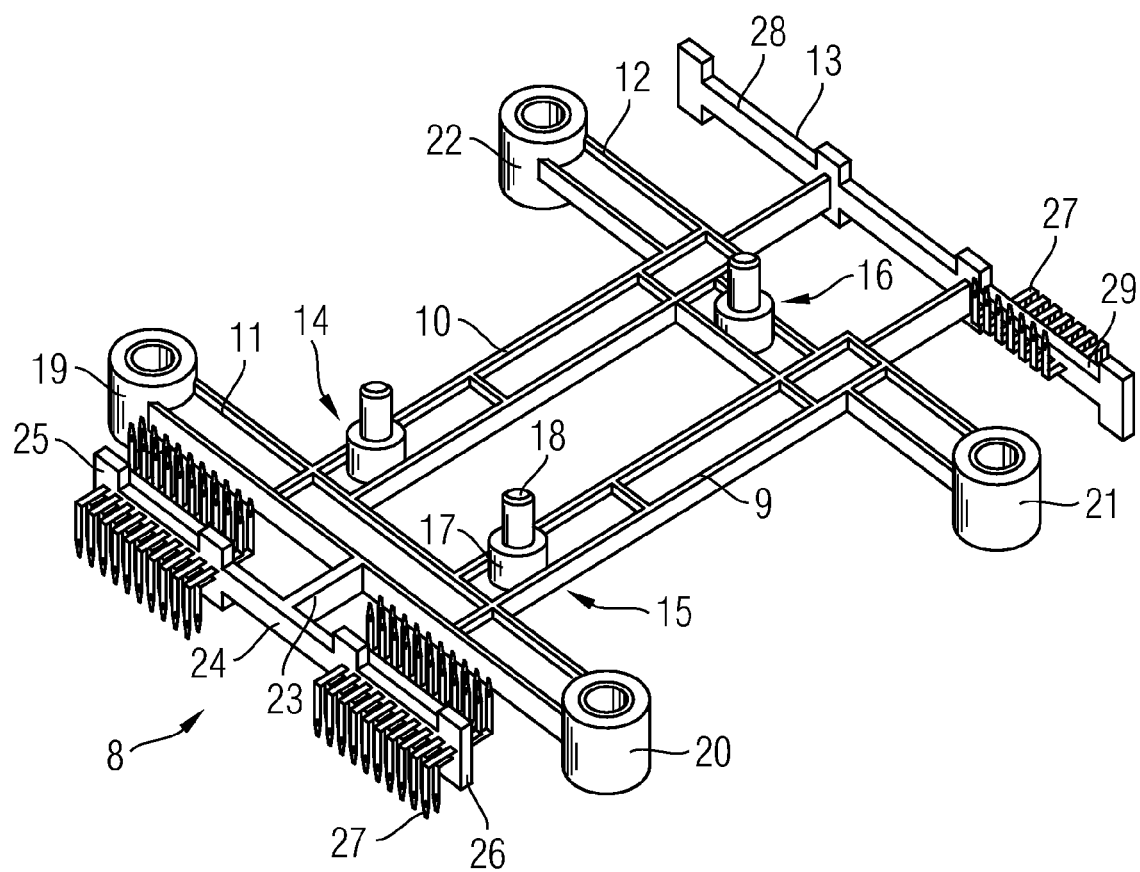
FIG. 3 shows a schematic representation of a top view of a first exemplary embodiment of a pressing frame according to the invention.

FIG. 3 shows a top view of a first exemplary embodiment of a pressing frame 8 according to the invention. The pressing frame 8 has two bars 9, 10 which preferably run in parallel to one another and which are fixedly positioned preferably by means of three transverse bars 11, 12, 13. In this way, the transverse bars 11, 12, 13 preferably form an angle of 90° with the bars 9, 10, with the respective end regions of the bars 9, 10 terminating with the transverse bars 11 and/or 13.

The transverse bar 12 is located between the transverse bars 11 and 13. Pressing spikes 14, 15, 16 are embodied on the bars 9, 10 as well as preferably centrally on the transverse bar 12, said pressing spikes being arranged in a positionally-identical fashion, i.e. at the same distance from the penetration bores 6 of the holding frame 1. The pressing spikes 14, 15, 16 have a preferably concentric bolt-like base body 17, which ends in a stud-like pin 18, which has a smaller diameter than the bolt-like base body 17. The transverse connectors 11 and 12 have at their 4 end regions preferably concentrically embodied positioning bolts 19, 20, 21, 22. The transverse bar 11, into which the bars 9, 10 lead on one side, leads into a central bar 23 on the other side. The central bar 23 leads into a pressing bar 24 which runs in parallel to the bar 11. The pressing bar 24 has connector regions 25, 26 with connectors above and below the middle bar 23 in each instance, in which connector regions Z-shaped pressing pins 27 are preferably mounted. The connectors of the connector regions 25, 26 can also preferably be arranged one below the other, so that the pressing pins 27 can be connected in two rows. The transverse bar 13, into which the opposite end regions of the bars 9, 10 lead, likewise has connector regions 28, 29, into which pressing pins 27 are mounted.

Figure 4:
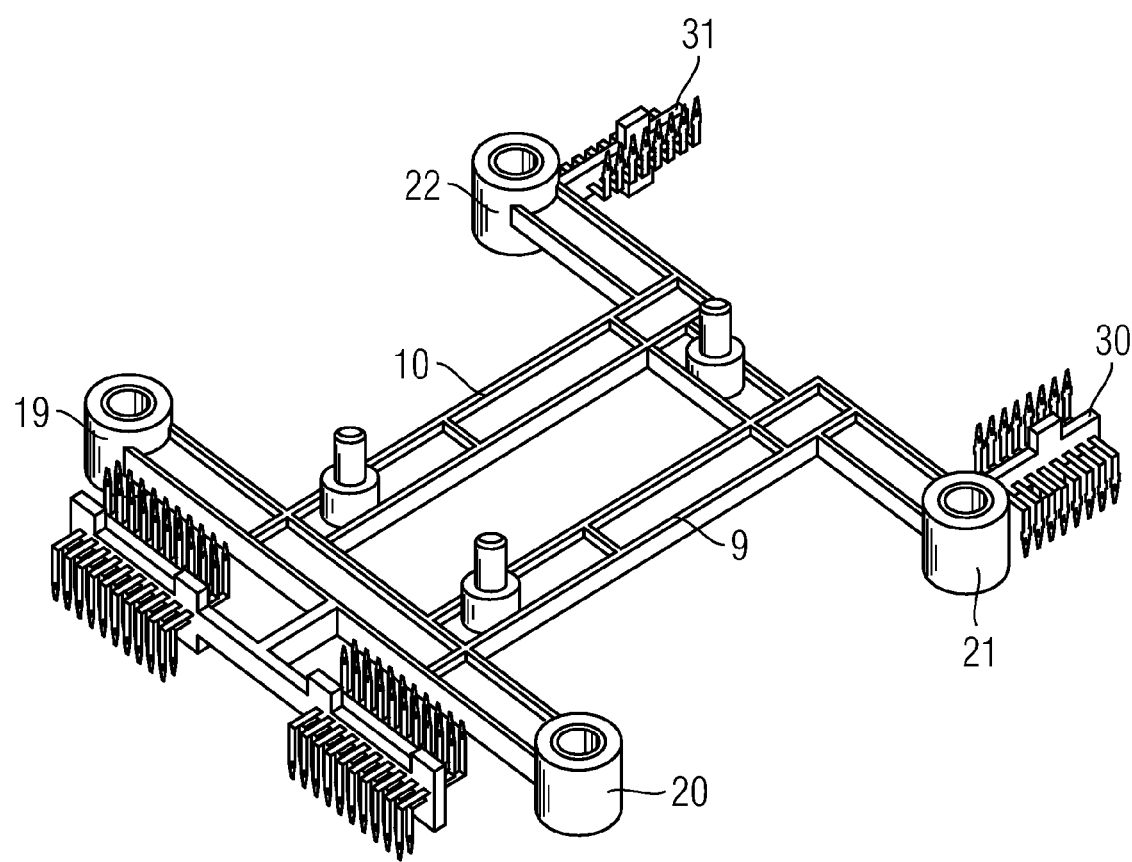
FIG. 4 shows a schematic representation of a top view of a second exemplary embodiment of the pressing frame according to the invention.

FIG. 4 shows a top view of a second exemplary embodiment of the pressing frame 8 according to the invention. In contrast to the first exemplary embodiment, the bars 9, 10 lead into the transverse bar 12. Connector regions 30, 31 are arranged on the positioning bolts 21, 22, said connector regions preferably forming an angle of 90° with the transverse bar 12. All further features were already described in FIG. 3.

Figure 5:
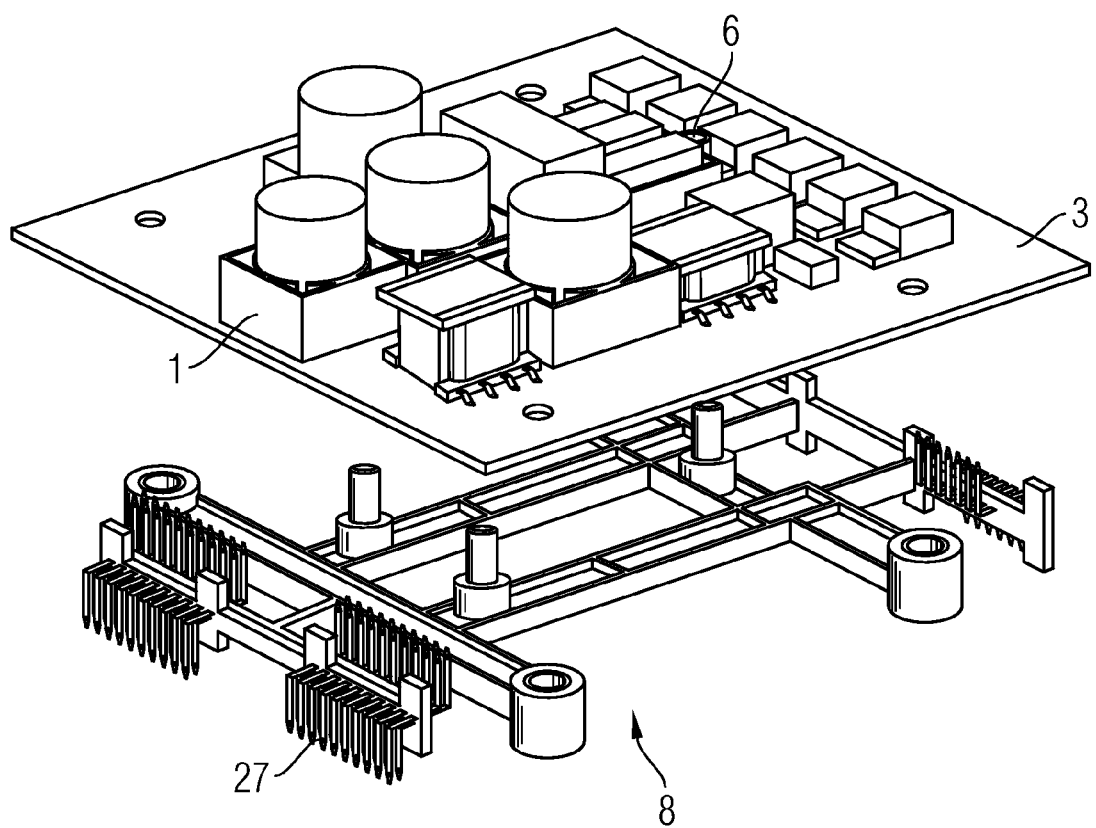
FIG. 5 shows a schematic representation of a perspective view of the holding frame positioned on the circuit board prior to pressing the pressing frame.

FIG. 5 shows a perspective view of the holding frame 1 positioned on the circuit board 3, prior to pressing the pressing frame 8 into the penetration bores 6 of the holding frame 1 as well as the bores of the circuit board 3 provided for the pressing pins 27. The combined fastening and contacting system according to the invention is thus designed in two parts and includes the holding frame 1 as well as the pressing frame 8.

Figure 6:
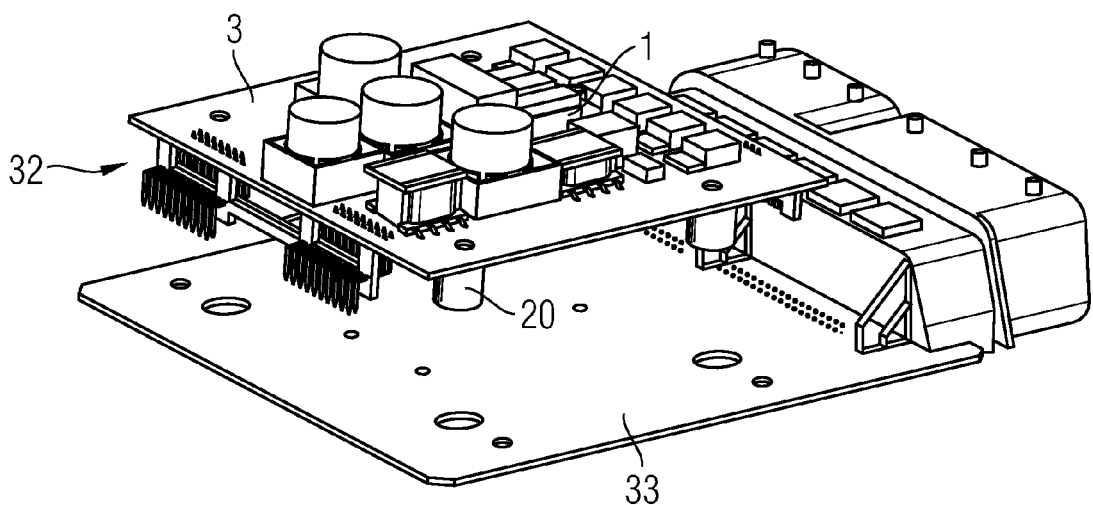
FIG. 6 shows a schematic representation of a perspective view of a combined module comprising a holding frame, circuit board, pressing frame prior to pressing into a main circuit board.

FIG. 6 shows a perspective view of a combined module 32 comprising a holding frame 1, circuit board 3 and pressing frame 8, prior to pressing into a main circuit board 33. In this way, the positioning bolts 19, 20, 21, 22 are used as spacers between the superimposed circuit boards 3, 33 following the pressing process.

Figure 7:
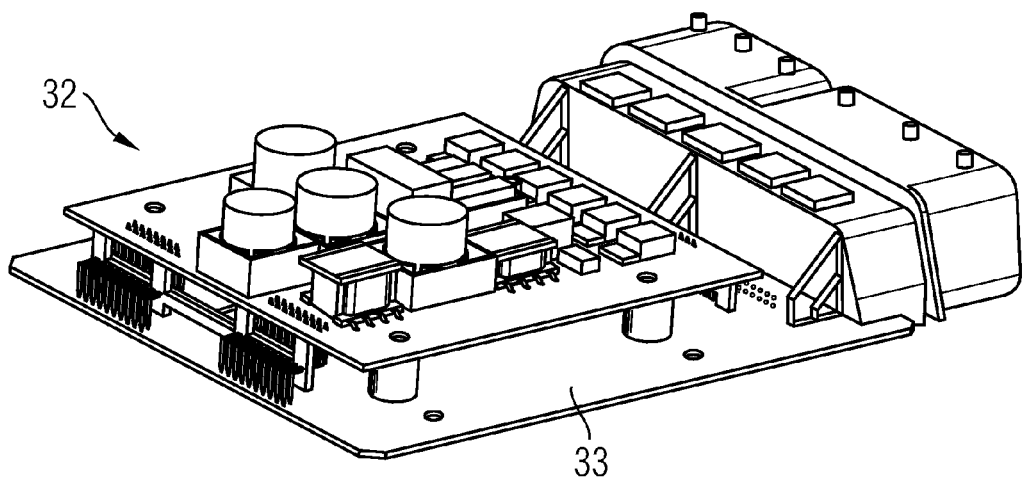
FIG. 7 shows a schematic representation of a perspective view of the combined module as claimed in FIG. 6 after pressing into a main circuit board.

FIG. 7 shows a perspective view of the combined module 32 according to FIG. 6 following the pressing into the main circuit board 33.

Figure 8:
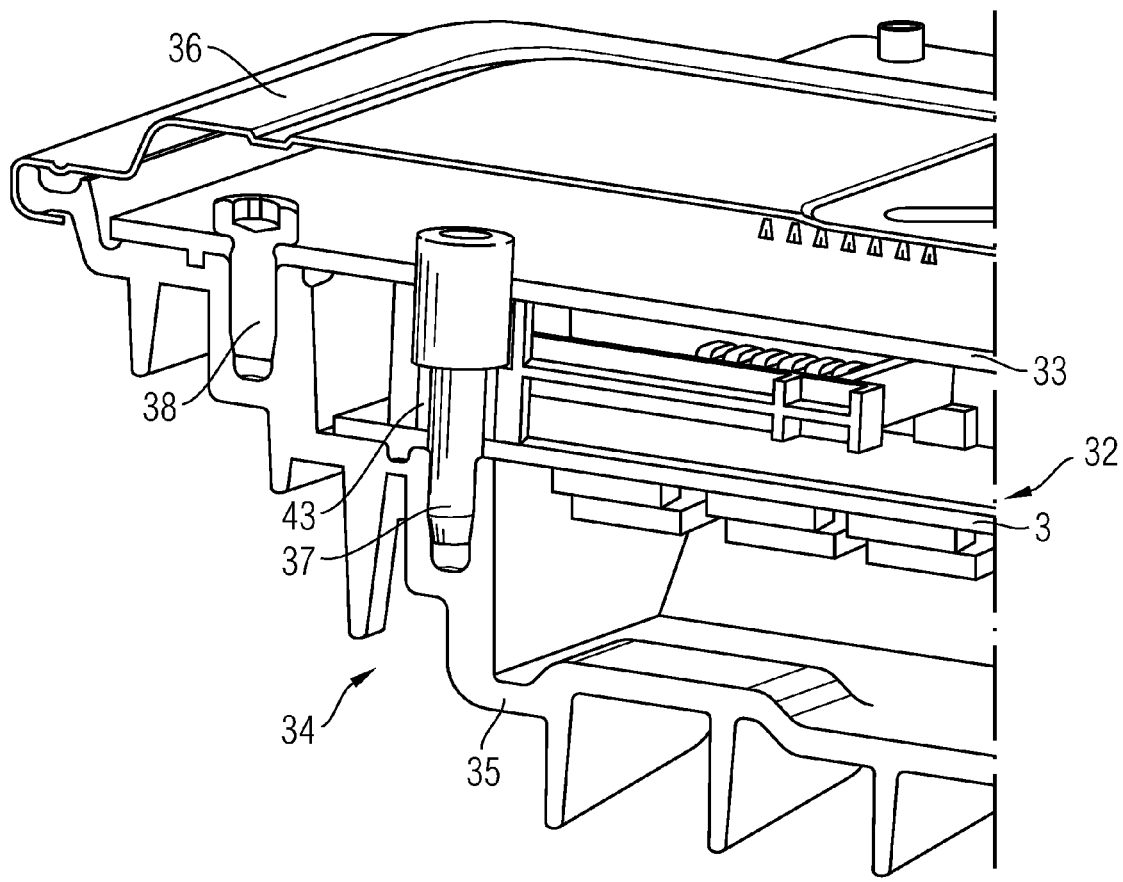
FIG. 8 shows a schematic representation of a perspective view of the combined module after assembly in an electronic housing.

FIG. 8 shows a perspective view of the combined module 32 with a main circuit board 33 following assembly into an electronic housing, which is preferably designed in two parts, comprising a housing cover 35 and a housing base 36. The main circuit board 33 and/or the combined module 32 are fastened to the housing cover 35 by means of fastening means 37, 38, such as screws for instance. One fastening possibility consists in fastening the main circuit board 33 to the housing cover 35 with a small screw 38, and in fastening the combined module 32 to the housing cover 23 with a large screw 37, which is guided through the main circuit board 33 and through the circuit board 35. A sleeve 43, preferably a metal sleeve 42, is guided along the thread element of the screw 37, said metal sleeve pressing the circuit board 3 against the housing cover 35 during the screwing process.

Figure 9:
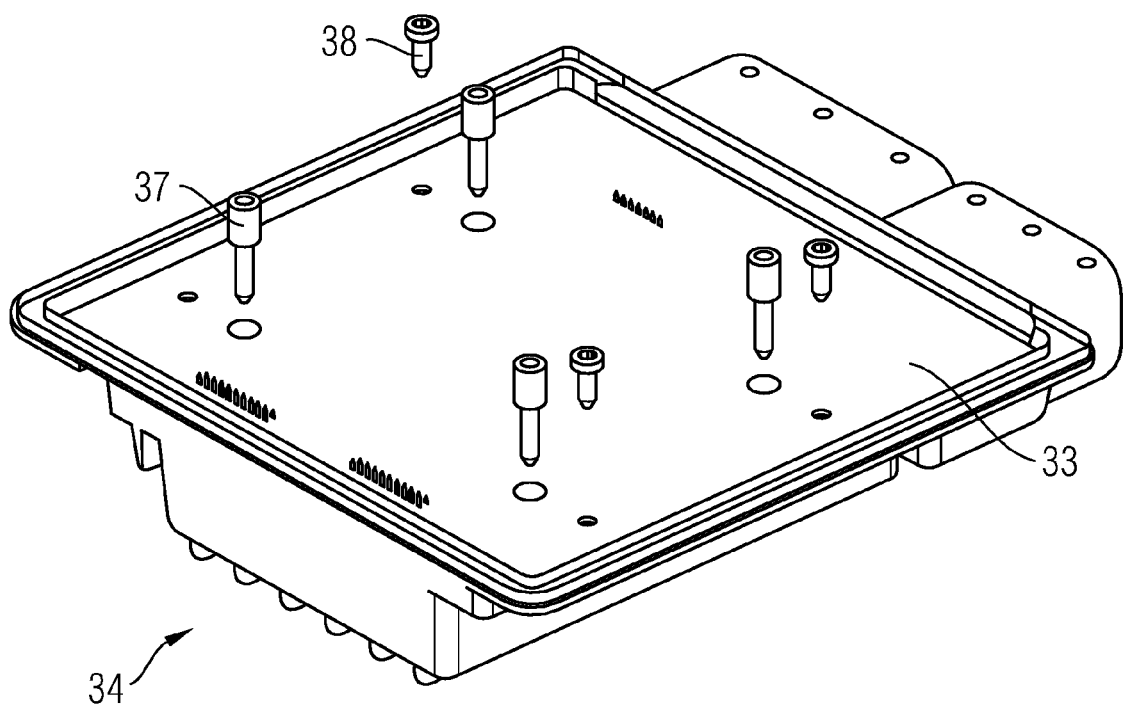
FIG. 9 shows a schematic representation of a perspective view of the assembly of the combined module in the electronic housing.

FIG. 9 shows a perspective view of the assembly of the combined module 32 and/or the main circuit board 33 into the electronic housing 34 by means of the fastening means 37, 38.

Figure 10:
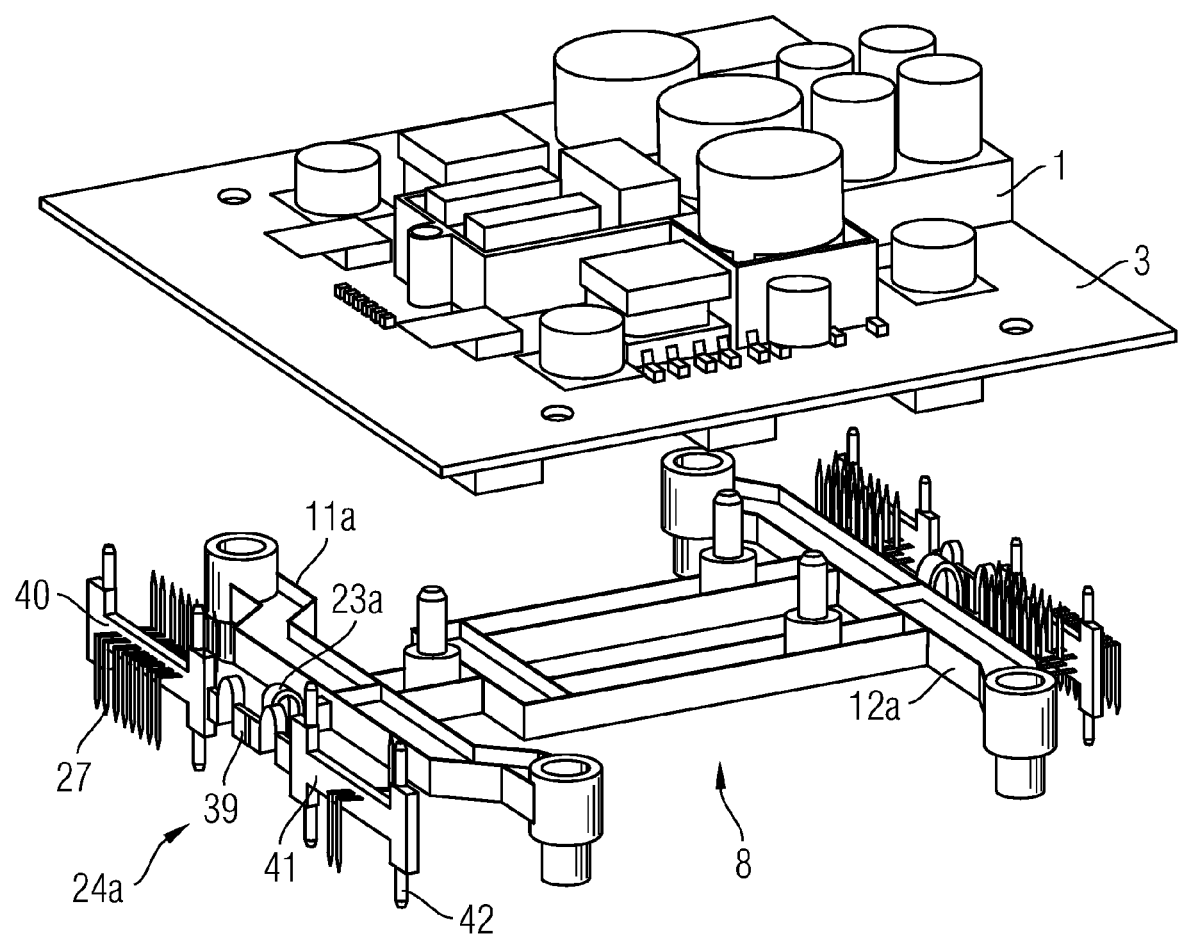
FIG. 10 shows a schematic representation of a perspective view of the holding frame positioned on the circuit board prior to pressing a further inventive pressing frame.

FIG. 10 shows a perspective view of the holding frame 1 positioned on the circuit board 3 prior to pressing the pressing frame 8 according to the invention. With the exemplary embodiment illustrated here, an elastic middle bar 23*a* is preferably arranged in each instance centrally on the transverse bars 11*a*, 12*a*, said middle bar leading into pressing bar 24*a*, with the pressing bar 24*a*, which runs in parallel to the transverse bars 11*a*, 12*a*, having an elastic center region 39, which, leads into a connector region 41, 41 for the pressing pin 27 on both sides. The connector regions 40, 41 each preferably have two centered pins 42.

Figure 11:
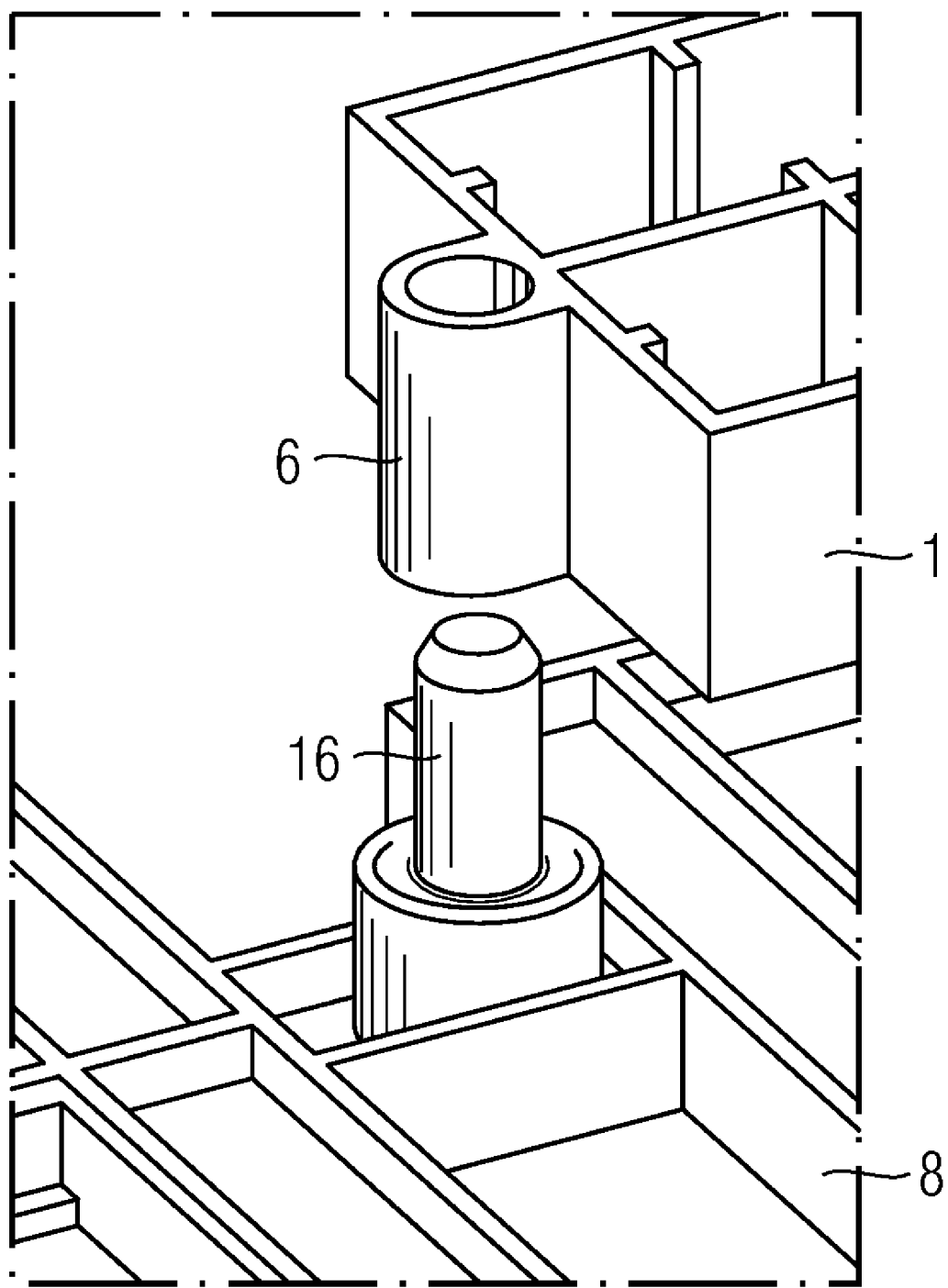
FIG. 11 shows a schematic representation of a perspective view of a penetration hole of an inventive holding frame as well as a pressing spike of an inventive pressing frame prior to the pressing process.

FIG. 11 shows a perspective view of a penetration bore 6 of a holding frame 1 according to the invention as well as a pressing spike 16 of a pressing frame 8 according to the invention prior to the pressing process.

Figure 12:
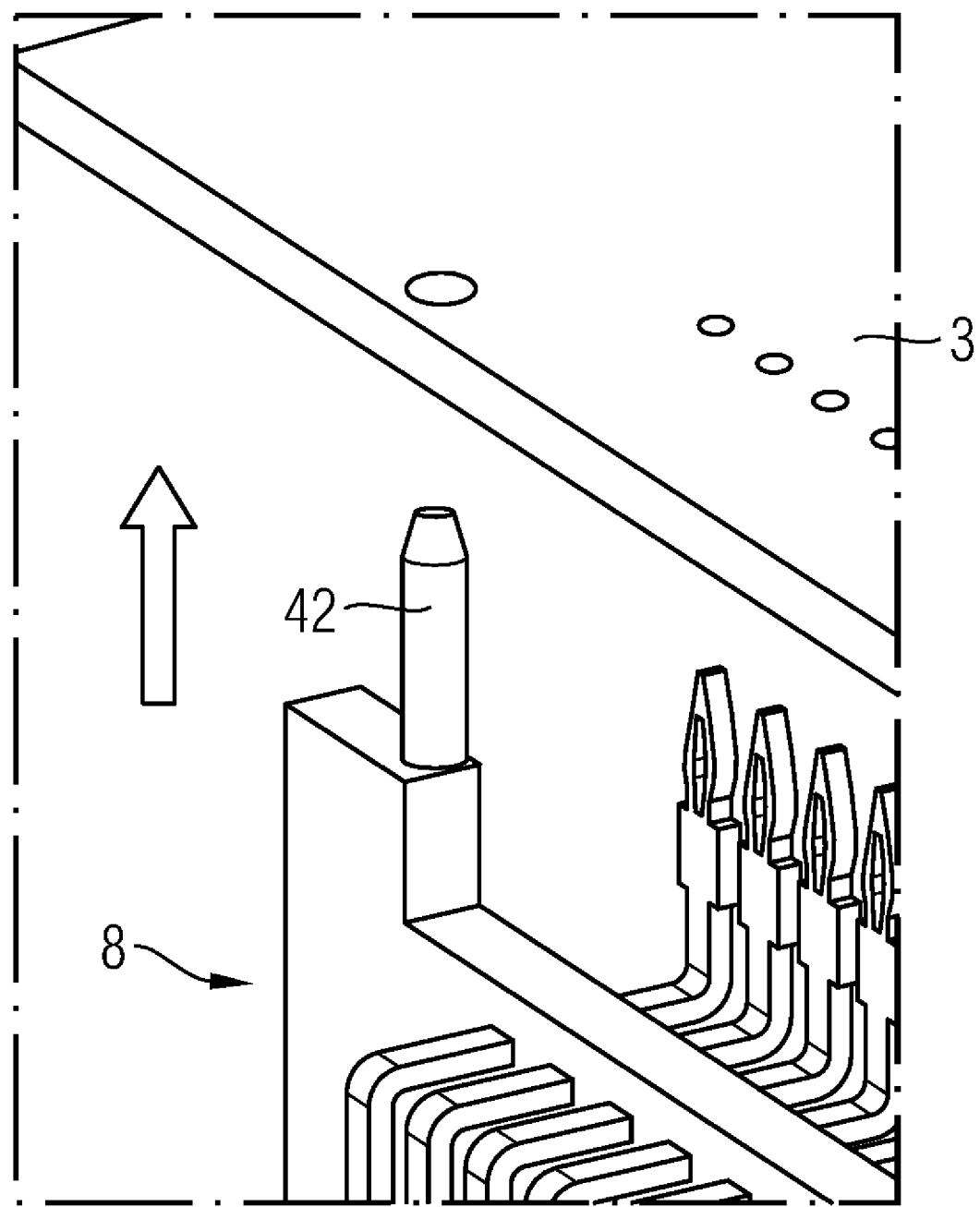
FIG. 12 shows a schematic representation of a perspective view of a centering pin of a holding frame prior to pressing into a circuit board.

FIG. 12 shows a perspective view of a centering pin 42 of a pressing frame 8 prior to the pressing process with the pressing direction shown in the direction of the arrow.

Figure 13:
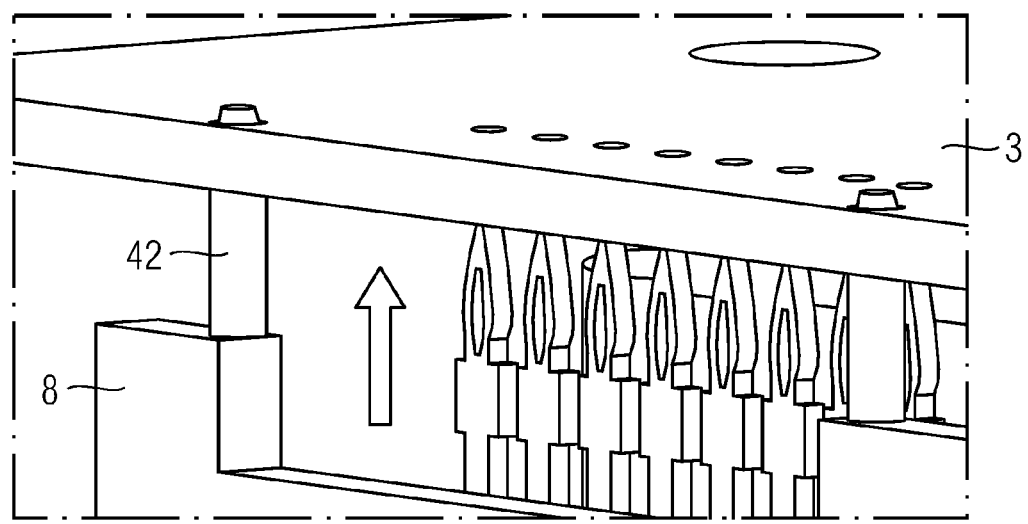
FIG. 13 shows a schematic representation of a perspective view of the pressing process of the centering pins.

FIG. 13 shows a perspective view of the centering pin 42 of the pressing frame 8 according to FIG. 12, following the pressing process with the pressing direction shown in the direction of the arrow.

Figure 14:
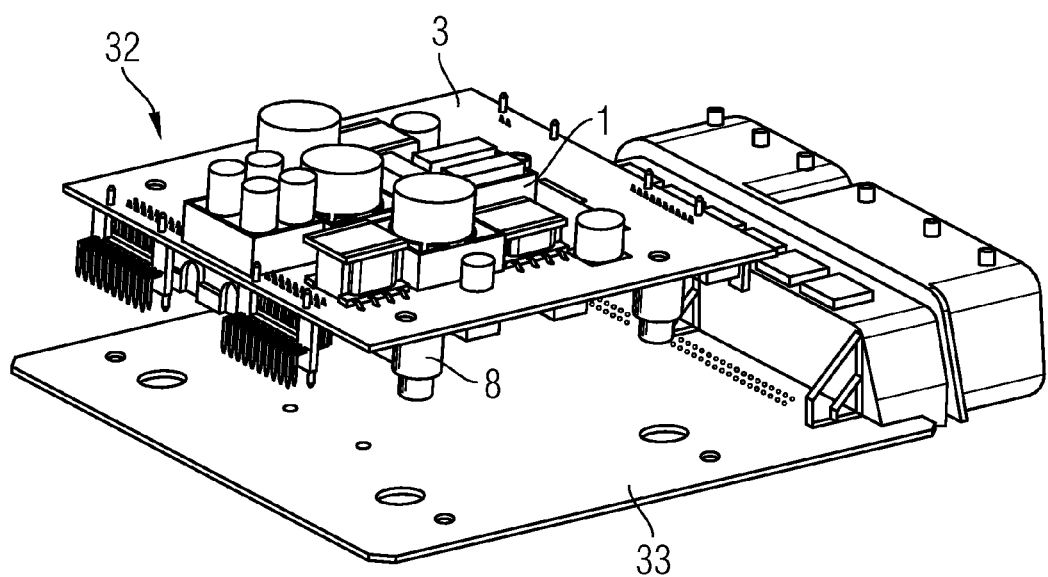
FIG. 14 shows a schematic representation of a perspective view of the combined module comprising a holding frame, circuit board and pressing frame prior to pressing into a main circuit board.

FIG. 14 shows a perspective view of the combined module 32, comprising a holding frame 1, circuit board 3 and pressing frame 8 prior to pressing into the main circuit board.

Figure 15:
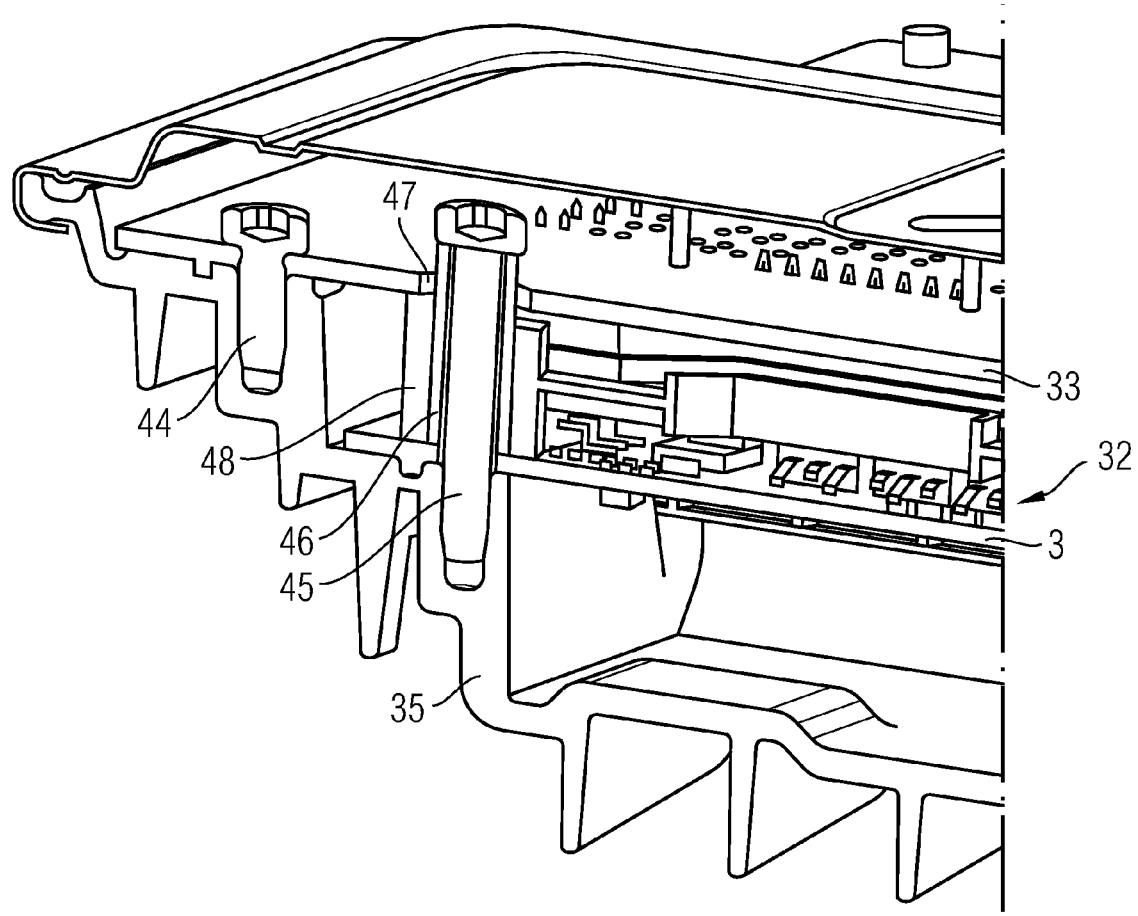
FIG. 15 shows a schematic representation of a perspective view of the combined module after assembly in an electronic housing.

FIG. 15 shows a perspective view of the combined module 32 with a main circuit board 33 following assembly in the electronic housing 34. The main circuit board 33 and/or the combined module 32 are fastened to the housing cover 35 by means of screws 44, 45. Provision is made here for the screw 44 to fasten the main circuit board 33 to the housing cover 35. The screw 45 is embodied such that the screw head protrudes over the circuit board 33 and does not rest on the circuit board 33. A sleeve 46, preferably a metal sleeve, is embodied along the thread element of the screw 45, said metal sleeve pushing the circuit board 3 onto the housing cover 35 by means of the screwing process. The screw 45 with the sleeve 46 is preferably inserted through an opening 47 in the circuit board 33 and into a guide connecting piece 48 preferably made of plastic, by means of screwing, before the combined module 32 is fastened to the housing cover 35. The diameter of the opening 47 is here greater than the diameter of the screw thread of the screw 45 with the sleeve 46. The guide connecting piece 48 thus does not rest on the circuit board 33. The guide connecting piece 48 and the opening 47 thus have tolerance regions, which prevent the circuit board 33 from also being permanently fixed by means of the screw 45. This alternative fastening prevents the circuit board 33 from being subjected to any stress, which could result in electrical contactings being interrupted.

The present invention firstly advantageously achieves a combined fastening and contacting system for electrical components on superimposed circuit boards, which allows faulty electrical components to be replaced in a simple fashion as well as allowing superimposed circuit boards to be electrically contacted in a safe manner. It is particularly suited to the automobile sector.

The invention claimed is:

1. A combined fastening and contacting system for electrical components on superimposed circuit boards in an electronic housing, the system comprising:
   a holding frame for electrical components forming a first part of the combined fastening and contacting system, said holding frame being formed with penetration bores;
   a pressing frame with pressing pins forming a second part of the combined fastening and contacting system for fixedly engaging said holding frame for electrical components substantially solely with a press fitting arrangement, said pressing frame being formed with pressing spikes for engaging said penetration bores and including centering pins; and said holding frame and said pressing frame sandwiching a main circuit board having electronic components for fixedly engaging said circuit board between said holding frame and said pressing frame.

2. The system according to claim 1, configured for incorporation in an automobile.

3. The system according to claim 1, wherein a circuit board is mounted between said holding frame and said pressing frame in a sandwich configuration.

4. The system according to claim 1, wherein said holding frame has differently molded connectors for the electrical components.

5. The system according to claim 1, wherein said pressing pins are Z-shaped.

6. The system according to claim 1, wherein said pressing frame comprises positioning bolts.

7. An assembly for fastening and contacting system for electrical components on superimposed circuit boards in an electronic housing, the system comprising:

an electronic housing;

a combined fastening and contacting system for the electrical components, said system having a holding frame with the electrical components forming a first part thereof, said holding frame being formed with penetration bores, and a pressing frame with pressing pins forming a second part thereof for fixedly engaging said holding frame for electrical components substantially solely with a press fitting arrangement, said pressing frame being formed with pressing spikes for engaging said penetration bores and including centering pins; and a circuit board having electronic components fixedly sandwiched in substantially solely press fitting engagement between said holding frame and said pressing frame inside said housing.

8. The assembly according to claim 7, wherein said circuit board is one of two superimposed circuit boards disposed in said housing.

9. The assembly according to claim 7, configured for incorporation in an automobile.

10. A method for fastening and contacting electrical components on superimposed circuit boards in an electronic housing, the method which comprises:

positioning a holding frame with penetration holes and connectors for electrical components on the top of a circuit board;

equipping the holding frame with electrical components;

positioning a pressing frame using pressing spikes, centering pins, and positioning bolts below the circuit board;

pressing the centering pins and pressing pins into the circuit board and/or pressing the pressing spikes into the penetration holes of the holding frame to form a combined module;

pressing this combined module on a main circuit board by means of the pressing pins and positioning bolts of the pressing frame, such that the holding frame for electrical components, pressing frame and circuit board fixedly engage each other substantially solely with a press fitting arrangement; and mounting the circuit boards fixed one above the other in an electronic housing.

* * * * *